(12) United States Patent
Routh et al.

(10) Patent No.: US 11,261,529 B2
(45) Date of Patent: Mar. 1, 2022

(54) REDUCED VISIBILITY CONDUCTIVE MICRO MESH TOUCH SENSOR

(71) Applicant: FUTURETECH CAPITAL, INC., Palo Alto, CA (US)

(72) Inventors: Robert Routh, Latham, NY (US); Michael Morrione, Jackson, CA (US); Jeffrey Hawthorne, Palo Alto, CA (US)

(73) Assignee: FUTURETECH CAPITAL, INC., Palo Alto, CA (US)

( * ) Notice: Subject to any disclaimer, the term of this patent is extended or adjusted under 35 U.S.C. 154(b) by 0 days.

(21) Appl. No.: 16/836,219

(22) Filed: Mar. 31, 2020

(65) Prior Publication Data

US 2021/0301403 A1 Sep. 30, 2021

(51) Int. Cl.
| | | |
|---|---|---|
| *G03F 7/16* | (2006.01) | |
| *C23C 18/22* | (2006.01) | |
| *C23C 18/40* | (2006.01) | |
| *C23C 18/16* | (2006.01) | |
| *G06F 3/044* | (2006.01) | |
| *B31F 1/07* | (2006.01) | |

(52) U.S. Cl.
CPC ............... *C23C 18/22* (2013.01); *B31F 1/07* (2013.01); *C23C 18/165* (2013.01); *C23C 18/405* (2013.01); *G03F 7/16* (2013.01); *G06F 3/044* (2013.01); *G06F 2203/04103* (2013.01); *G06F 2203/04112* (2013.01)

(58) Field of Classification Search
None
See application file for complete search history.

(56) References Cited

U.S. PATENT DOCUMENTS

| | | | |
|---|---|---|---|
| 2002/0104681 A1* | 8/2002 | Ishiwa ................... | H05K 1/144 174/250 |
| 2006/0185533 A1* | 8/2006 | Saueressig ............... | B31F 1/07 101/22 |
| 2010/0224317 A1* | 9/2010 | Kawamura ........ | C23C 18/1893 156/277 |
| 2010/0243149 A1* | 9/2010 | Hashimoto .......... | H05K 1/0265 156/272.8 |
| 2011/0183088 A1* | 7/2011 | Shimizu ................. | B41M 3/06 428/32.39 |
| 2012/0105354 A1* | 5/2012 | Narasimhan ........ | G06F 3/04886 345/174 |
| 2013/0314648 A1* | 11/2013 | Rappoport ............... | G02B 1/11 349/96 |

(Continued)

*Primary Examiner* — Shamim Ahmed
(74) *Attorney, Agent, or Firm* — Womble Bond Dickinson (US) LLP; Joseph Bach, Esq.

(57) ABSTRACT

A method for fabricating a metallic wire mesh touch sensor with reduced visibility. A metallic wire mesh is formed on a transparent substrate such that the surface of the metallic wires is roughened or textured, so as to cause high scattering of incident light, thereby minimizing specularly reflected light towards the user. The metal lines are formed over patterned catalytic photoresist. The rough or textured surface of the metallic wires is achieved by roughening or texturing the catalytic photoresist, by selecting parameters of electronless plating of copper, or both. An RMS surface roughness of about 50 nm would scatter approximately 70% of incident cyan light incident at 30°.

17 Claims, 4 Drawing Sheets

(56) References Cited

U.S. PATENT DOCUMENTS

| | | | |
|---|---|---|---|
| 2015/0158263 A1* | 6/2015 | Maddala | B31F 1/07 427/147 |
| 2015/0192707 A1* | 7/2015 | Ehrensperger | G02B 5/0257 359/599 |
| 2015/0378464 A1* | 12/2015 | Kao | G06F 3/045 345/175 |
| 2016/0291478 A1* | 10/2016 | Petcavich | G06F 3/044 |
| 2018/0018041 A1* | 1/2018 | Omote | H05K 3/0023 |
| 2019/0263048 A1* | 8/2019 | Kenna | H01M 8/0213 |

\* cited by examiner

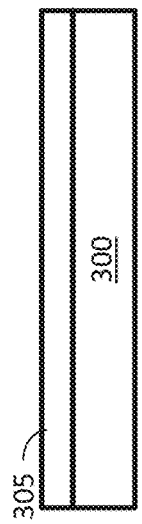
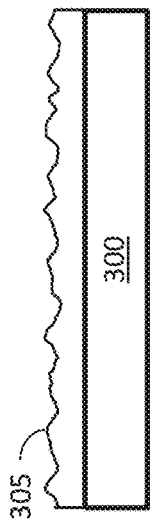
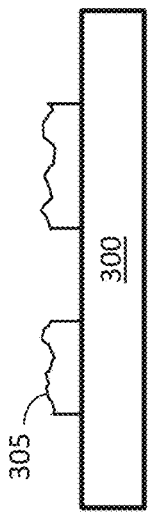
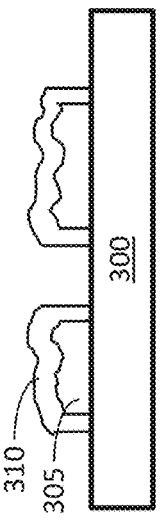
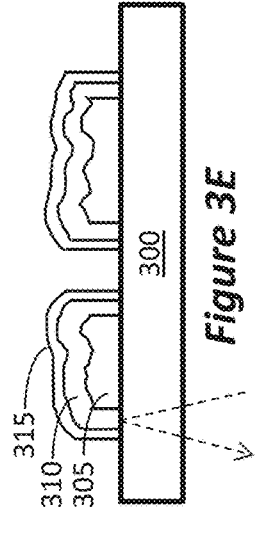
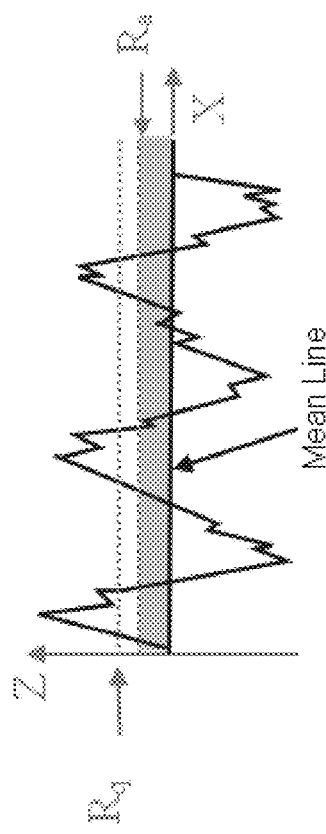
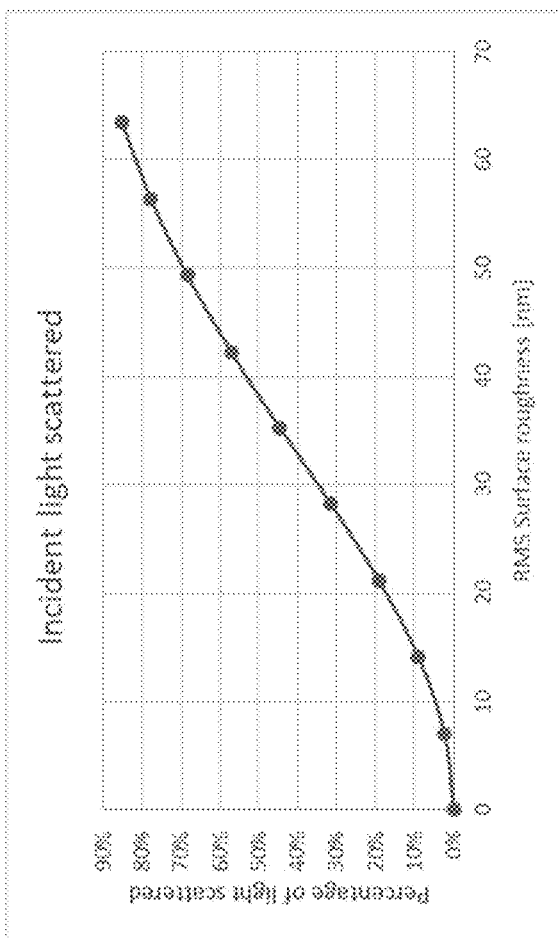

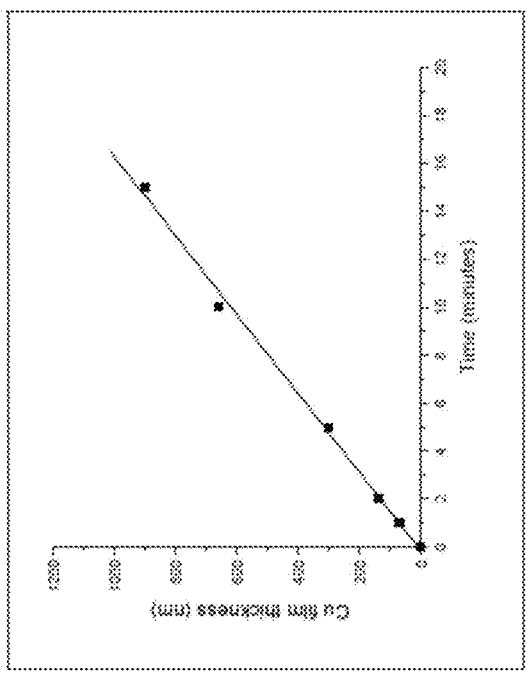
*Figure 4*
| Deposition time (min.) | RMS roughness (nm) | Average roughness (nm) | Valle-peak roughness (nm) |
|---|---|---|---|
| 1 | 10.32 | 8.33 | 106.89 |
| 2 | 11.79 | 9.39 | 120.88 |
| 5 | 14.65 | 11.59 | 132.34 |
| 10 | 20.29 | 15.95 | 180.94 |
| 15 | 21.88 | 17.21 | 198.76 |
| 30 | 36.81 | 28.82 | 291.25 |
| 60 | 60.77 | 48.06 | 469.76 |
*Figure 5*
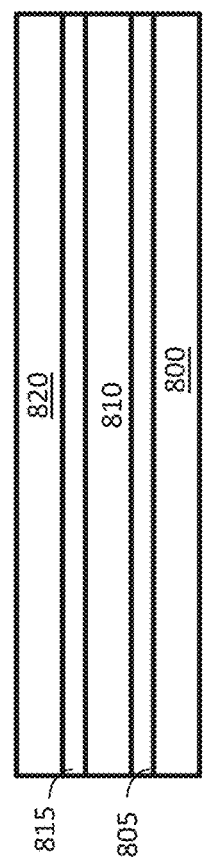
*Figure 8*

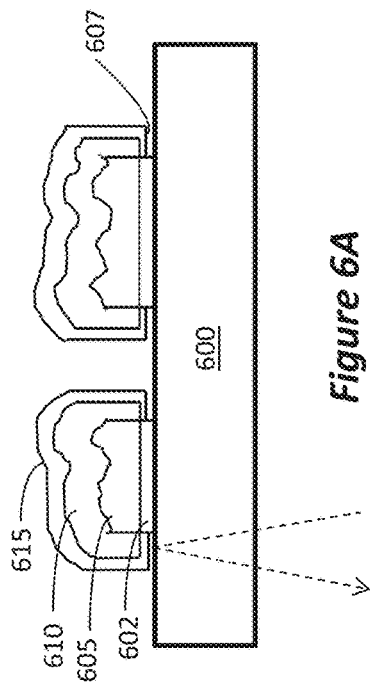
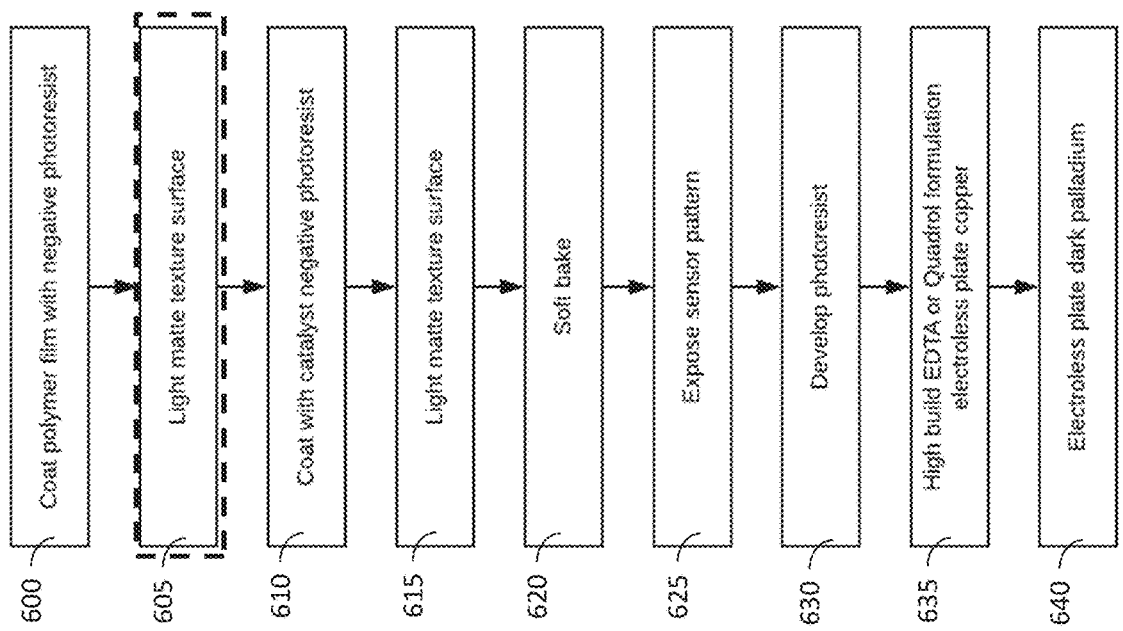
Figure 6A
Figure 6

REDUCED VISIBILITY CONDUCTIVE MICRO MESH TOUCH SENSOR

BACKGROUND

1. Field

This disclosure relates generally to the field of touch sensors. More particularly, the disclosure relates to metallic micro mesh touch sensor for touch screens.

2. Related Art

A touch screen enabled system allows a user to control various aspects of the system by finger touch or stylus motion on the screen. A user may interact directly with one or more objects depicted on a display device by fingers or stylus that are sensed by the touch sensor. The touch sensor typically includes a conductive pattern disposed on a substrate configured to sense the exact position of the finger or stylus. Touch screens are commonly used in consumer, commercial, and industrial systems.

The conductive pattern of touch screens has been traditionally made from transparent conductive material, such as indium tin oxide (ITO). However, with the advent of multi-touch screen systems and large displays, it is advantageous to have highly conductive micro mesh systems, for example, conductive micro mesh systems using copper fine lines. Copper is a much better conductor than ITO. However, there are a number of challenges with highly conductive micro mesh systems, including metallic mesh touch sensors. For example, a big challenge with metallic mesh touch sensors is visibility to eyes of end users. At certain angles, in particular under bright lights or outdoors, metallic lines of the conductive mesh touch sensors may be highly reflective and distracting to the end users.

It is generally desirable to reduce the visibility of the conductive pattern in a metal mesh touch sensor applications. Visibility relates to the visibility of the conductive pattern itself to an end user under normal operating conditions, which may include evaluation when the underlying display device is on and when the underlying display device is off. Visibility may change depending on the type of ambient illumination.

Ambient light sources can have a variety of intensities and angular light distributions. Cloudy days or fluorescent lamps with a diffuser are examples of low intensity, wide angle light distribution. Narrow angle, high intensity light sources include the sun, which is essentially a collimated light, and a variety of halogen and LED light sources packaged in parabolic reflectors. LED and halogen lights known as MR16 and PAR30 can have light distribution angles ranging from 15 degrees to 45 degrees and provide lights at different temperatures (frequencies).

A narrow angle, high intensity light source illuminating a touch screen with the display off will create the most demanding conditions. The metal mesh lines become more visible given the mainly specular reflection of light off of the planar top surfaces of the conductive pattern metal mesh traces facing the end user. Moreover, the general process of forming the metal mesh naturally leads to the metal lines having a smooth surface finish, which generate specular reflection of incident light.

The conductive pattern may be rendered more visible to an end user as a result of the feature size and geometry of the conductor, the reflected color, the conductor reflectivity, and/or optical scattering phenomena of the conductive pattern or passivation layer applied to the conductive pattern.

Copper and copper alloys provide high conductivity, high flexibility, low material cost, and ease of electroless and electrolytic plating. As such, the use of copper or copper alloys as a base metal in a metallic conductive pattern may be desirable. However, the use of copper or copper alloys in a conductive pattern presents a number of challenges. For example, the light reflected from copper or copper alloys exhibit a copper color, rendering a conductive pattern more visible to an end user under normal operating conditions. In addition, copper or copper alloys are prone to surface oxidation on exposure to ambient conditions and are prone to corrosion in certain environmental conditions.

With respect to reliability and environmental performance metrics, a conductive pattern is prone to degradation from use and other causes overtime. Depending on the type of degradation, the reliability may be affected by the development of electrical opens or electrical shorts upon continued operation. Consequently, the reliability, functionality, and useable life of the conductive pattern, or a touch sensor in which it may be disposed, may be substantially reduced. Degradation may occur as a result of oxidation, day-to-day usage, electro-migration, airborne, solution-based, or liquid based exposure to the environment, and/or exposure to corrosive agents such as soft drinks, coffee, oils, bodily fluids, acids, caustics, atmospheric pollutants, environmental pollutants, salt water, or water with contaminants such as salts, minerals, or ions.

To address the issues of copper visibility and reliability, an oxide or sulfide layer may be deposited on the copper or copper alloy. The oxide or sulfide layer will change the color to a darker color thus reducing the reflectance and color of the copper conductor. This process can also be referred to as blackening. An oxide layer, which may also be referred to as a treated layer or a reacted layer, may be formed by the initiation and cessation of a chemical reaction. This chemical reaction may be initiated by a selenium compound, a sulphate compound, or a triazole compound. The mechanism used to apply the reactant may be a spray or a dip process, either of which may be used with the above compounds. The reactant is applied, and the reaction can continue until it is stopped by a rinsing process to remove the reactant.

However, these layers consume a substantial portion of the copper or copper alloy in the process, potentially decreasing conductivity and increasing resistivity, and potentially become insulators. Consequently, the copper or copper alloy must be thick, such as, for example, greater than 5 micrometers, to start with because a substantial amount of the copper or copper alloy is consumed. However, copper or copper alloy having such a thickness may result in stress, poor adhesion, and other failure modes, especially when deposited by an electroless plating process. In addition, the copper or copper alloys may be prone to electro-migration. As such, it is difficult to achieve micrometer-fine feature sizes in conductive patterns comprised of copper or copper alloys. The other drawback with this method is controlling the thickness uniformity of the oxide or sulfide layer, which in turn affect the reflectance and color of the reflected light. The non-uniform reflected conductor pattern can be objectionable to the end user.

An alternative method to reduce visibility and improve reliability of the copper conductor is to plate a second metal on top of the copper, usually palladium or nickel. A second metal layer of 10-50 nanometers thickness is enough to eliminate the copper color reflection. The reflected light color from a palladium or nickel coating layer is neutral gray color. Forming the palladium or nickel layer by electroless plating process consumes less of the underlying copper allowing a thinner initial copper layer to used. The uniformity of the reflected color of the second metal is less sensitive to thickness variation as long a minimum thickness of 10 nanometers is deposited. Additionally, palladium or nickel is a less reactive metal and provides a passivation layer for the underlying copper.

The palladium or nickel coating eliminates copper colored reflection and produces a less visible gray color uniform reflection. However, the palladium or nickel has a high reflectance value of greater than 80 percent and does not eliminate or reduce the overall specular reflection under high ambient light. The metal coated conductor typically has a planar surface facing the end user with a high gloss surface finish. As a result, most of the incident light is specularly reflected off of the conductor surface. Given the high percentage of light specularly reflected from the conductor surface, the metal mesh conductors will be visible to the end user, particularly under narrow angle, high ambient light and display off conditions.

Accordingly, a need exists in the art for improved metal mesh touch sensor which is as invisible to the user as possible, in any illumination situations.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments significantly reduce the percentage of specularly reflected light by nanometer scale roughening or texturing of the conductor planar surface. Nano roughening or texturing will increase the amount of scattering of the incident light, thus reducing the amount of light specularly reflected towards the user.

In some embodiments a method for fabricating a metallic wire mesh touch sensor with reduced visibility is provided. A metallic wire mesh is formed on a transparent substrate such that the surface of the metallic wires is roughened or textured, so as to cause high scattering of incident light, thereby minimizing specularly reflected light towards the user. The metal lines are formed over patterned catalytic photoresist. The rough or textured surface of the metallic wires is achieved by roughening or texturing the catalytic photoresist, by selecting parameters of electroless plating of copper to control the surface roughness of the plated copper, or a combination of both. An RMS surface roughness of about 50 nm would scatter approximately 70% of incident cyan light incident at 30°.

In some embodiments a touch sensor is provided, comprising: a transparent substrate; a first catalytic photoresist pattern over a first surface of the substrate; a second catalytic photoresist pattern over a second surface of the substrate; a first copper layer over the first catalytic photoresist pattern, the first copper layer having RMS surface roughness of at least 20 nm; a second copper layer over the second catalytic photoresist pattern, the second copper layer having RMS surface roughness of at least 20 nm; a first passivation layer over the first copper layer; and, a second passivation layer over the second copper layer.

In disclosed embodiments, a touch screen is provided, comprising a display screen, a touch sensor over the display screen, and a cover glass, wherein the touch screen comprises a transparent substrate; a first catalytic photoresist pattern over a first surface of the substrate; a second catalytic photoresist pattern over a second surface of the substrate; a first copper layer over the first catalytic photoresist pattern, the first copper layer having RMS surface roughness of at least 20 nm; a second copper layer over the second catalytic photoresist pattern, the second copper layer having RMS surface roughness of at least 20 nm; a first passivation layer over the first copper layer; and, a second passivation layer over the second copper layer.

According to further embodiments, a system for fabricating a touch sensor is provided, comprising: a supply roller supporting a roll of substrate film; a deposition station forming catalytic photoresist layers over a first and second surfaces of the substrate film, wherein the catalytic photoresist comprises a composition of photoresist and catalytic nanoparticles; a first embossing station having a first embossing roll and a first backing roll, the first embossing roll having a roughened or textured surface and positioned over the first surface of the substrate film; a second embossing station having a second embossing roll and a second backing roll, the second embossing roll having a roughened or textured surface and positioned over the second surface of the substrate film; an exposure station having a UV light source generating a UV light beam, optical elements splitting the UV light beam into two sub-beams, and directing one sub-beam towards the first surface and the second sub-beam towards the second surface.

According to disclosed aspects, a method for fabricating a metal-mesh touch sensor is provided, comprising: providing a roll of flexible substrate film; passing the substrate film through a deposition station and forming catalytic photoresist layers over a first and second surfaces of the substrate film, wherein the catalytic photoresist comprises a composition of photoresist and catalytic nanoparticles; passing the substrate film through a first embossing station having a first embossing roll and a first backing roll, the first embossing roll having a roughened or textured surface, thereby roughening or texturing the catalytic photoresist layer on the first surface; passing the substrate film through a second embossing station having a second embossing roll and a second backing roll, the second embossing roll having a roughened or textured surface, thereby roughening or texturing the catalytic photoresist layer on the second surface; passing the substrate film through an exposure station and transferring a pattern onto the catalytic photoresist layers by exposing the catalytic photoresist layers to UV light through patterned masks; developing the catalytic photoresists to form patterned photoresists; forming copper layers over the patterned photoresists by electroless plating; and, forming passivation layers over the copper layers.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a graph illustrating the roughness measurement showing arithmetical mean deviation and RMS surface roughness.

FIG. 2 illustrates a plot of incident light scattering for cyan light incident at 30°.

FIGS. 3A-3E illustrate a process for fabricating metallic wire mesh for touch sensor according to an embodiment.

FIG. 4 illustrates a plot of film thickness vs. plating time, according to an embodiment.

FIG. 5 is a table illustrating surface roughness vs. deposition time according to an embodiment.

FIG. 6 illustrates a process flow for fabricating a touch sensor according to an embodiment, while FIG. 6A illustrates an example of a structure obtained by the process of FIG. 6.

FIG. 8 is a cross-section of a touch screen according to an embodiment.

DETAILED DESCRIPTION

Figure 7:
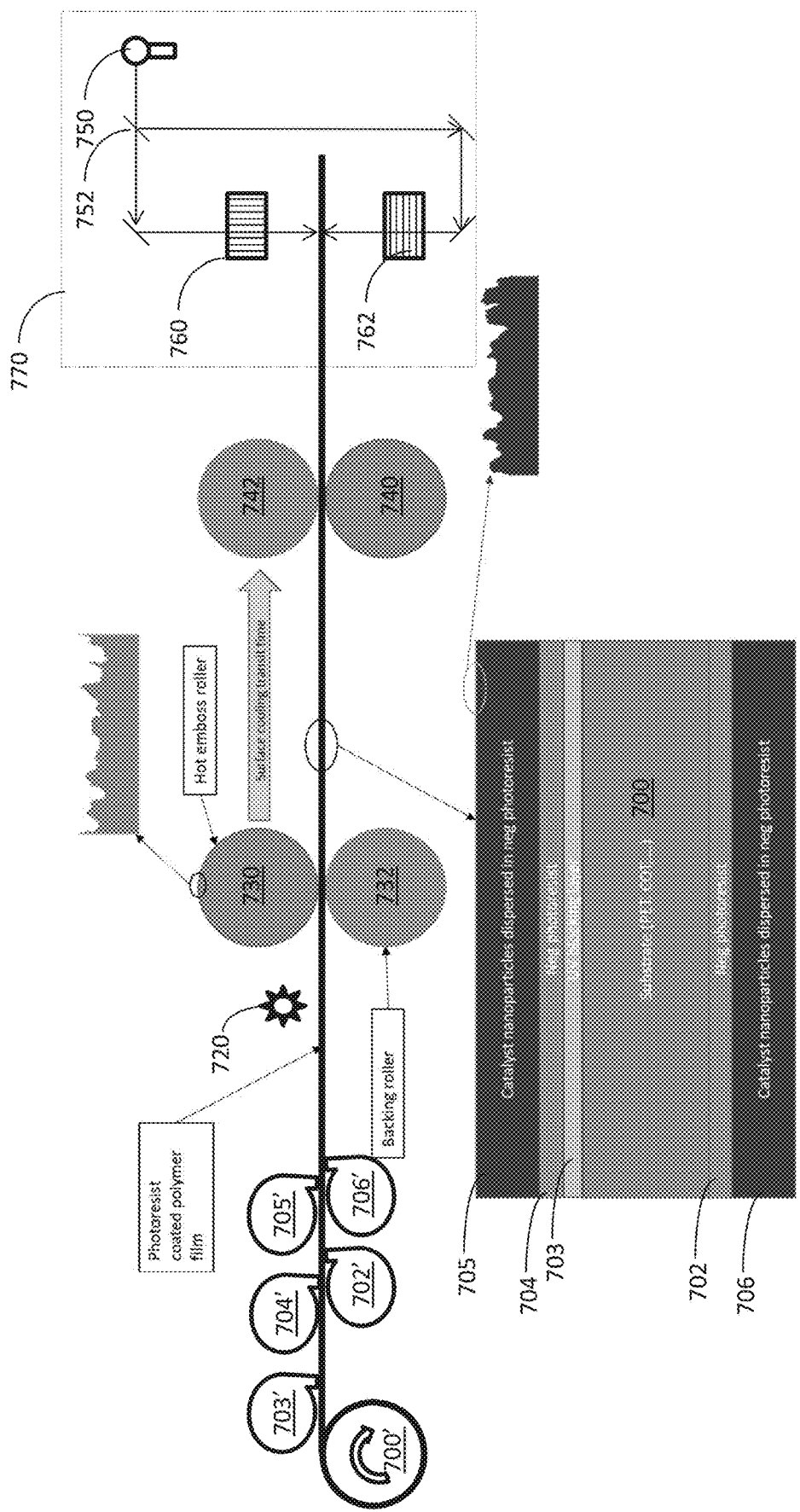
FIG. 7 illustrates an arrangement for fabricating textured or roughened catalytic photoresist on both sides of the substrate, according to an embodiment.

Embodiments of the inventive metallic mesh touch sensor will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Disclosed embodiments utilize roughening or nano-texturing in order to scatter incident light to avoid reflection towards the user. The type of surface finish and structure will determine if the scattering is uniform (Lambertian) or have a directional preference (non-Lambertian). For the purpose of reducing the visibility of the conductive pattern to an end user, a Lambertian scattering surface is preferred. A lower amount of the incident light will be reflected to the end user and the amount of reflected light will remain constant regardless of the angle of incident light or the angle the end user views the conductive pattern.

A Lambertian reflector surface can be approximated using a rough surface of randomly located and varying height peaks and valleys. Surface roughness is usually specified as the arithmetical mean deviation of assessed profile (Ra). The RMS surface roughness (Rq) is related to the mean deviation by Rq=1.41*Ra, as illustrated in FIG. 1. The total amount light scattered for randomly rough surface is approximated by:

$$\frac{TIS}{Ro} = 1 - \exp\left(-\frac{4\pi Rq \cos(\theta)}{\lambda}\right)^2$$

Wherein TIS is the total integrated scatter, Rq is RMS surface roughness [nm], Ro is the theoretical reflectance of the surface, θ is the angle of incident light (measured from a normal to the surface, i.e., from the sensor's surface the angle is 90°−θ), and λ is the wavelength of light [nm].

FIG. 2 illustrates a plot of incident light scattering for cyan light (λ=500 nm, i.e., midway between green and blue) incident at 0=30°. For an RMS surface roughness of 50 nm approximately 70% of the incident light is scattered, which is an Ra=35.5. Therefore, aspects of the disclosure include forming a metallic wire mesh for a touch sensor wherein the surface of the metallic wires is roughened or textured. The rough surface can be created by roughening the layers below the metallic wire, generating a rough surface while forming the metallic wires, or both. The following are examples for fabrication of a metallic wire mesh for a touch sensor wherein the surface of the metallic wires is roughened or textured.

FIGS. 3A-3E illustrate the fabrication of a metallic wire mesh touch sensor according to an embodiment. It should be appreciated that the cross-section of FIGS. 3A-3E is an enlarged view of a small part of the sensor. In FIG. 3A, transparent substrate 300 may be polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP"), polyester, polycarbonate, glass, copolymers, blends, or combinations thereof. In other embodiments, transparent substrate 300 may be any other transparent material suitable for use as a touch sensor substrate such as eagle glass, flexible glass, and quartz. The composition of transparent substrate 300 may vary based on an application or design.

A photoresist layer 305 is deposited on the substrate 300. For simplicity, in FIG. 3 the processing is illustrated on one side of the substrate only, but both sides may be processed to generate metallic wire mesh on both sides of the substrate. The photoresist layer 305 is made of a catalytic photoresist composition, which may include a positive or negative photoresist component and a catalyst component that may include catalytic nanoparticles. In some embodiments, the negative photoresist may be advantageous. In some embodiments, the negative photoresist may be acrylic phenolic polymer. In other embodiments, the negative photoresist may be acrylic, epoxy, urethane, or combinations of one or more of the aforementioned compositions. The negative photoresist may vary in accordance with some embodiments of the present disclosure.

The catalytic nanoparticles are embedded in the photoresist in order to form nucleation sites for the electroless deposition of metal, e.g., copper. By having catalyst nanoparticles in the photoresist composition, and then patterning the photoresist, the catalyst nanoparticles will form nucleation sites only over the developed photoresist, so as to form the mesh design. The catalytic nanoparticles may be made of, e.g., silver nanoparticles.

In certain embodiments, the catalytic photoresist composition 220 may include negative photoresist component content in a range between approximately 30 percent and approximately 95 percent by weight and catalyst component content in a range between approximately 5 percent and approximately 70 percent by weight. In other embodiments, the catalytic photoresist composition 220 may include negative photoresist component content in a range between approximately 50 percent and approximately 70 percent by weight and catalyst component content in a range between approximately 30 percent and approximately 50 percent by weight.

In some embodiments, the size of the catalytic nanoparticles may range from 5 to 250 nanometers, for example, the catalytic nanoparticles may have a size of 15-25 nanometers. The nanoparticles may be metal, such as silver. For example, the photoresist may be an epoxy-based negative resist SU8 infused with silver nanoparticles.

The catalytic nanoparticle composition may be applied to the substrate by a number of techniques such as gravure, reverse gravure, slot die, spray, flexographic, or Meyer rod techniques. The catalytic nanoparticle composition after drying and baking may range in thickness from 1 to 100 microns. For example, the catalytic nanoparticle composition may have a thickness of 5 to 25 microns.

As deposited, the catalytic photoresist exhibits a very smooth surface with a RMS roughness of less than 1 nm and a total height variation of only 2 nm. From the TIS model disclosed above, a reflective surface with this RMS roughness would scatter less than 5% of the incident light. The majority on the incident light would be specularly reflected, thus enhancing the visibility of the metallic wire mesh. Various surface treatments can be employed to increase the RMS roughness of the photoresist. In FIG. 3B the catalytic photoresist 305 may undergo soft bake to remove the majority of the solvent used during the photoresist coating process. Then, the face of the catalytic photoresist is roughened by chemical etch, arc plasma or embossing, as will be detailed below.

In one embodiment, wet chemical etch is employed to roughen the surface of the photoresist 305. In one embodiment the substrate with the photoresist was immersed in ceric ammonium nitrate etch solution for one hour at 50° C. Such wet etch produced an RMS roughness of 1 nm to 3 nm.

According to another embodiment, plasma dry etch is used to roughened the surface of the photoresist. In one embodiment, the photoresist was exposed to an oxygen plasma treatment, using a low frequency (40 kHz) RF-plasma chamber and an oxygen pressure of 0.4 mbar. In a treatment of about an eight-minute plasma etch time, an RMS roughness of 3 nm-6 nm can be achieved.

According to yet another embodiment, a low temperature, atmospheric argon plasma treatment is employed. However, it is noted that argon plasma etch is not as effective as oxygen plasma etch, as argon plasma process is a physical sputtering process, while oxygen plasma etch also involves chemical reaction.

According to a further embodiment, embossing is used to roughen or texture the surface of the photoresist. According to an embodiment, heat transfer rolls are used to transfer the roll's surface topography to the photoresist, while also controlling the temperature across the roll's surface. Heat transfer rolls can be engineered to control the temperature across the roll's face to within +/−1° F.

In an embodiment, a heat transfer roll is prepared by having its surface roughened. In an embodiment, the RMS surface roughness of the heat transfer roll is generated by controlled grit blasting into a hard chromium plated deposit, creating a matte finish. In general terms, matte finishes can be categorized into 3 roughness categories:
  Light: 20-40 Ra;
  Medium Matte: 40-60 Ra; and,
  Course Matte: Exceeding 60 Ra In an embodiment, the embossing process is accomplished by adjusting the heat transfer roller temperature such that the photoresist is taken above its non-cross-linked melting point of 55° C., and hot embossed with a roller pressure of, e.g., 10 PSI between the heat transfer roller and the backing roller. The embossing method can achieve higher RMS roughness compared to chemical etch or arc plasma texturing methods. Incidentally, the backing roller may have a smooth surface.

In an embodiment, the steps illustrated in FIGS. 3A and 3B are performed in a roll to roll processing system. In an embodiment, a roll to roll coating system is used to deposit the photoresist layers on the polymer film substrate, and roll to roll drying ovens are used to soft bake the photoresist. Also, a heated embossing roller and backing roller station can be added after the drying oven. A minimum RMS surface roughness of 50-60 nm should be used to ensure that most of the incident light will be scattered and to compensate for some smoothing due to the thickness of the copper layer. The electroless plated copper layer will be 400-800 nm thick. The plated copper layer will follow the contours of the textured photoresist layer; however, will smooth out the sharper peaks and valleys. The second metal (or passivation) layer is less than 50 nm and does not substantially alter the RMS surface roughness.

As noted, in embodiments both sides of the substrate may be fabricated to provide metallic wire mesh on both sides of the substrate. Accordingly, a separate heated embossing roller and backing roller station may be used to emboss the opposite side photoresist layer. In an embodiment, spacing is provided between embossing stations to allow for cooling of the first surface after embossing of the first surface and prior to embossing the opposite surface. The spacing will depend on required cooling time and web speed of the coating system.

In FIG. 3C the process proceeds to pattern the photoresist. The embossed surface photoresist coated film is patterned by selectively exposing the photoresist to UV light through a mask. The exposed photoresist is then developed using standard photoresist development process. In some embodiments, the developer may include a water-based alkaline solution. In other embodiments, the developer may include an organic solvent such as, for example, Carbitol™, or Dowanol™. The composition of the developer may vary with the catalytic photoresist composition in accordance with some embodiments of the present disclosure.

In FIG. 3D the process proceeds to forming the metallic mesh 310. In an embodiment, the metallic mesh 310 is made of copper or copper alloy. In an embodiment, the copper or copper alloy is electroless plated over the catalytic photoresist 305. As noted, the catalytic nanoparticles within the photoresist 305 form nucleation sites for the electroless plating, such that the copper plates only over the catalytic photoresist, thereby forming the pattern of the mesh.

The copper forming mesh 310 is reflective and appears reddish. Also, copper may easily oxidize and also migrate. Therefore, in FIG. 3E the process proceeds to plating a second metal layer 315, that may function as a passivation layer, protection layer, and reflection reducing layer, all at once. In an embodiment, a second metal of palladium or nickel is electroless plated on the copper layer to change the reflected light color to a neutral gray color and to passivate the copper layer.

Thus, a method for fabricating a metallic mesh for a touch sensor is provided, comprising: providing a transparent substrate, forming on at least one surface of the substrate a layer of catalytic photoresist, roughening or texturing the surface of the photoresist, patterning the photoresist to generate a patterned photoresist, plating the photoresist with a first metal layer, and plating the first metal layer with a second metal layer. The catalytic photoresist may be a composition of photoresist and catalytic nanoparticles. Roughening or texturing the surface of the photoresist may be performed by wet etch, dry plasma etch, or embossing. Also, for texturing, nano-imprint lithography (NIL) may be used to transfer a texture design onto the photoresist.

As noted, another method for roughening the surface of the metal is by proper control of the deposition process. For example, the surface roughness of the electroless plated copper can be affected by plating rate and film thickness. Higher plating rates and thicker films will have higher RMS surface roughness. The major tradeoff with faster plating rates and thicker films is they can produce highly stressed films that are more prone to cracking and adhesion failure.

Examples of high-rate electroless copper plating formulation include Quadrol® (BASF Corporation, Delaware) and Ethylenediaminetetraacetic acid (EDTA) as chelating agents. Quadrol polyol is N, N, N', N'-Tetrakis (2-hydroxypropyl) ethylene-diamine. Quadrol is used as a cross-linking agent and as a catalyst. The four hydroxyl groups in Quadrol give multiple cross-linking sites and the two tertiary nitrogen atoms provide catalysis for the reaction. In one example the Quadrol-based electroless solution is made with 2.2 grams/litter copper salt (as a source for $Cu^{2+}$), 13 g/L Quadrol, 3 g/L formaldehyde, 8 g/L NaOH and less than 2 g/L of additives (e.g., 2-mercaptobenzothiazole, diethyldithiocarbamate, 2.2'-dipyridyl, potassium ferrocyanide, vanadium pentoxide, nickel chloride, and polyethylene glycol). At temperature of about 43° C., plating rate is about 2.5 μm/20 minutes.

In one example the EDTA-based electroless solution is made with 2.0 grams/litter copper salt, 30 g/L disodium EDTA, 3 g/L formaldehyde, 7 g/L NaOH and less than 2 g/L of additives (e.g., 2-mercaptobenzothiazole, diethyldithiocarbamate, 2.2'-dipyridyl, potassium ferrocyanide, vanadium pentoxide, nickel chloride, and polyethylene glycol). At temperature of about 45° C., plating rate is about 2.0 μm/20 minutes.

As can be seen, high (heavy) build electroless plating deposits two to three microns in about 20 minutes. These processes typically operate at elevated temperature (e.g., 35° C. to 55° C.), but room temperature formulations are also possible. These baths are usually based on EDTA or Quadrol chemistry and tended to generate coarse grained deposits and produce somewhat highly stressed deposits, especially at higher limits of deposit thickness.

In disclosed embodiments, organic additives are included to serve as stabilizers. However, stabilizers can also have an effect on grain size and surface finish. In one example, the surface roughness vs. film thickness for an EDTA formulation with additives has been examined. FIG. 4 illustrates data points for a copper film thickness growth over time. The solution used for electroless deposition of copper is: CuSO4.5H2O was used as the source of $Cu^{2+}$, EDTA as a complexing agent, formaldehyde as the reducing agent, 2,2'-dipyridyl as stabilizer, and KOH to adjust the pH. The bath temperature was 65° C. and its pH was in the range of 12-12.2. FIG. 5 illustrates the atomic force microscope (AFM) measurement of the copper surface roughness for various plating times. As illustrated in FIG. 5, the surface roughness increases with longer deposition times, i.e., the thickness of the copper layer.

To drastically reduce the conductor visibility, the target RMS surface roughness should be 40-60 nm. To achieve this surface roughness by control of copper plating only would require a film thickness of 2-4 μm and plating time of 30-60 minutes. However, such a film may have too much stress. Accordingly, in an embodiment, copper thickness of 600-800 nm is formed by plating process of about 9-12 minutes. It is believed that such a compromise would result in a well adhered copper mesh with a roughened surface to scatter at least some of the light, thus reducing its visibility.

Thus, a method for fabricating a metallic mesh for a touch sensor is provided, comprising: providing a transparent substrate, forming on at least one side of the substrate a layer of catalytic photoresist, patterning the photoresist to generate a patterned photoresist, plating the patterned photoresist with a first metal layer by a process that generates rough surface of the first metal layer, and plating the first metal layer with a second metal layer. The plating process is configured for electroless plating over a time period of 9-12 minutes and generating a layer of 600-800 nm in thickness. The plating process is configured for electroless plating that generates roughness on a copper layer surface of about 15-21 nm RMS. The plating solution includes at least one of EDTA or Quadrol.

In an embodiment both roughening method may be combined. For example, higher RMS surface roughness can be achieved using a combination of lightly texturing the photoresist surface prior electroless plating of copper. Then, using a high build rate electroless copper plating formulation, plating copper having rough surface. In one example, a roller with an RMS surface roughness of 20-30 nm is applied to the photoresist surface prior to the soft bake. This simplifies the coating process by eliminating the need for a temperature controlled hot roller embossing step. The copper plating is formed to a thickness of 600-800 nm, resulting in inherent RMS surface roughness of 20 nm. The resultant combined RMS surface roughness of the electroless copper plated photoresist is 40-50 nm.

As illustrated by the dashed arrow in FIG. 3E, light may reflect from the edge of the copper lines. To avoid this problem, prior to depositing the catalytic photoresist, a layer of standard resist without the catalyst may be deposited. In this manner, the copper coating will adhere only to the catalyst photoresist, thus not reaching the surface of the substrate 300. The second coating of passivation metal would then cover the bottom edge of the copper line, thus preventing incident light from reflecting off of the edge of the copper lines.

FIG. 6 is a flow chart illustrating a process incorporating several of the features disclosed above, according to one embodiment. In this example, a polymer film is used as a substrate and a negative photoresist is used. As indicated above, other materials may be used as a substrate, and a positive photoresist may also be used. Also, different steps may be performed and different order of steps may be utilized, but mixing processes and features disclosed herein.

In step 600 the substrate is coated with a photoresist layer. This layer utilizes a standard photoresist to which copper will not plate due to lack of nucleation sites. Optionally (exemplified by the dashed lines), at step 605 the surface of the photoresist is roughened or textured. In this example it is textured to a light matte level, i.e., 40-60 Ra. Thereafter, or immediately after step 600, at step 610 a layer of catalytic photoresist is deposited over the standard photoresist. At step 615 the surface of the catalytic photoresist is roughened or textured, here to a light matte level, i.e., 40-60 Ra. At step 620 the structure undergoes soft bake to remove the solvent used during the photoresist coating process. It is beneficial to perform soft back prior to step 625 of pattern exposure in order to have repeatable expose process and dimensional stability of features of the mesh design.

At step 625 the layers of photoresist and catalytic photoresist are exposed to UV radiation that is passed through a patterned mask, so that the pattern is transferred to the photoresist and catalytic photoresist. At step 630 the combination of resist layers is developed so that only a patterned resist remains on the substrate.

At step 635 a layer of conductive metal, e.g., copper, is plated over the patterned photoresist. In this example, a high build electroless plating formulation is used, e.g., using EDTA or Quadrol formulation. This process is performed for a period of 9-12 minutes, to grow copper to a thickness of 600-800 nm. At step 640 a second darker metal layer is deposited over the first metal layer. In this example, palladium is electroless plated over the copper. Since the copper does not reach all the way to the substrate, the palladium plates over the edges of the copper as well.

An example of a structure obtained by the process of FIG. 6 is illustrated FIG. 6A. As shown, photoresist 602 is deposited over the substrate 600. Then, catalytic photoresist 605 is deposited over the photoresist 602. The catalytic photoresist 605 has a textured upper surface, but in this example the standard photoresist 602 is not roughened or textured. A first metallic layer 610, e.g., copper, is deposited over the catalytic photoresist. However, since the catalytic photoresist 605 is offset from the substrate by the standard photoresist 602, a gap 607 is formed when the copper plates the catalytic photoresist. When the second metal 615 is plated over the first metal, it can reach into the gap 607 to plate the edge of the first metal 610. Consequently, as illustrated by the broken line arrow, incident light hits the dull second metal, e.g. palladium, such that light reflection is much attenuated.

In an embodiment, a touch sensor is fabricated on a roll to roll system, while forming metallic wire mesh on both sides of the substrate. The relevant parts of the system are illustrated in FIG. 7. Specifically, the substrate 700 is a continuous roll that is fabricated while transferring from a supply roll 700' to a receiving roll (not shown), and thereafter is cut to separate the multiple sensors fabricated. As shown in the first-level callout, a standard photoresist 702 is deposited on one side of the substrate, here the bottom side. On the opposite side, a UV blocker layer 703 is first deposited and then a standard photoresist 704 is deposited over the UV blocker layer 703.

The UV blocker layer 703 is provided in order to enable UV light exposure of the photoresist stacks on either side without affecting the photoresist stack on the other side. This is because the substrate and the photoresist stacks are transparent to UV light, such that UV light incident on one side of the substrate would expose the opposite side as well. However, since the pattern of the mesh on either side of the substrate is different, the UV exposure on each side must pass through a different mask, thereby generating a different pattern on each side of the substrate. Notably, the UV blocker layer may be used in any of the embodiments disclosed herein when forming a mesh on both sides of the substrate.

The catalytic photoresist layers 705 and 706 are formed over the standard photoresist 704 and 702, respectively. If needed, a soft bake station 720 may be included in order to evaporate the solvent used during the photoresist deposition process. While in FIG. 7 the soft bake station is illustrated prior to the embossing rollers, as noted herein the soft baking may be performed after the embossing.

The substrate is passed through a first roller pair, having hot embossing roller 730 and backing roller 732. As shown in the callout, the surface of the hot embossing roller 730 is roughened, and the roughened texture is embossed onto the catalytic photoresist 705, as shown in the second-level callout. A second roller pair having hot embossed roller 740 and backing roller 742 is placed at a separation distance from the first roller pair sufficient to allow the cooling of the surface embossed by the first roller pair. The second roller pair embosses the opposite side, i.e., catalytic photoresist 706.

In the embodiment illustrated in FIG. 7, both catalytic photoresists are exposed to UV light simultaneously in an exposure station 770. For simplicity, exposure station 770 is illustrated as receiving the substrate film 700 from the same source roller 700'; however, generally exposure station 770 is separate and the substrate film is transferred to the exposure station and may be rolled onto a different source roller 700'. In either case, in the exposure station 770 a UV light source 750 generates a UV light beam. Optical elements 752, e.g., a half mirror, splits the UV light beam into two beams, one directed towards the top of the substrate and one directed towards the bottom of the substrate. One of the beams is passed through pattern mask 760 and transfers the pattern onto the top photoresist stack 704 and 705, while the other beam is passed through the second pattern mask 762 and transfers the pattern onto the bottom photoresist stack 702 and 706.

Thus, a system for fabricating a touch sensor is provided, comprising: a supply roll 700' supporting a roll of flexible substrate film 700; a first deposition station 703' depositing a UV blocker layer 703 over a first surface of the substrate 700; a second deposition station 705' depositing a catalytic photoresist 705 on the first side of the substrate; a third deposition station 706' depositing catalytic photoresist 706 on a second surface of the substrate 700; a soft back station 720; a first roller pair having one emboss roller 730 and one backing roller 732, the emboss roller 730 having roughened surface and positioned to emboss the catalytic photoresist 705 on the first side of the substrate 700; a second roller pair having one emboss roller 740 and one backing roller 742, the emboss roller 740 having roughened surface and positioned to emboss the catalytic photoresist 706 on the second side of the substrate 700.

The system may also include a first standard resist deposition system depositing photoresist on the surface of the UV blocker layer and a second standard resist deposition system depositing photoresist on the second surface of the substrate.

The system may also include a UV exposure station including a UV light source 750, an optical splitter 752 splitting a UV beam from the UV light source 750 into two beams; a first pattern mask 760 and a second pattern mask 762, wherein one of the two beams passes through the first pattern mask 760 and transfers a pattern onto the catalytic photoresist 705 on the first side of the substrate 700, and the other of the two beams passes through the second pattern mask 762 and transfers a pattern onto the catalytic photoresist 706 on the second side of the substrate 700.

Any of the disclosed embodiments may be employed to fabricate a touch screen as illustrated in FIG. 8. The touch screen includes a display screen 800, e.g., an LCD, an OLED, etc. An optically clear adhesive 805 layer is used to adhere a touch sensor 810 over the display screen 800. In other embodiments, the space between the display screen 800 and the touch sensor 810 may be occupied by an isolation layer (e.g., resin) or air gap. The touch sensor 810 may be fabricated according to any of the embodiments disclosed herein. A second layer of optically clear adhesive 815 may be used to adhere cover glass 820 to the touch sensor.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method for fabricating a metal-mesh touch sensor, comprising:
   providing a transparent substrate;
   forming a catalytic photoresist layer on at least one surface of the transparent substrate, wherein the catalytic photoresist comprises a composition of photoresist and catalytic nanoparticles;
   transferring a pattern onto the catalytic photoresist layer by exposing the catalytic photoresist layer to UV light through a patterned mask;
   developing the catalytic photoresist to form a patterned catalytic photoresist;
   roughening upper surface of the patterned catalytic photoresist to generate a root mean square (RMS) surface roughness of from 40 nm to 60 nm;
   forming a copper layer over the patterned catalytic photoresist by electroless plating; and,
   forming a passivation layer over the copper layer.

2. The method of claim 1, wherein the roughening the upper surface is configured to form a combined RMS surface roughness of the patterned catalytic photoresist and the copper layer of from 40 nm to 50 nm.

3. The method of claim 2, wherein forming a copper layer comprises plating in an electroless plating solution to achieve copper layer thickness of 600-800 nm.

4. The method of claim 1, wherein roughening comprises dipping the patterned catalytic photoresist in a wet etch solution.

5. The method of claim 1, wherein roughening comprises etching the patterned catalytic photoresist using oxygen plasma etch.

6. The method of claim 1, wherein the roughening comprises embossing the patterned catalytic photoresist with an embossing roller.

7. The method of claim 6, wherein roughening further comprises forming a copper layer by electroless plating in an electroless solution comprising one of Quadrol or Ethylenediaminetetraacetic acid (EDTA) as chelating agents.

8. The method of claim 7, wherein the electroless plating is performed to generate copper layer thickness of 600-800 nm.

9. The method of claim 7, wherein the embossing is performed to generate RMS surface roughness of 20-30 nm of the patterned catalytic photoresist and the electroless plating is performed to generate RMS surface roughness of 20 nm of the copper layer, thereby cumulatively resulting in RMS surface roughness of 40-50 nm of the copper layer.

10. The method of claim 1, wherein roughening comprises forming a copper layer by electroless plating in an electroless solution comprising one of Quadrol or Ethylenediaminetetraacetic acid (EDTA) as chelating agents to generate copper RMS surface roughness of from 20 to 40 nm.

11. The method for fabricating a metal-mesh touch sensor according to claim 1, wherein:
   providing the transparent substrate comprises providing a roll of flexible substrate film;
   forming the catalytic photoresist layer comprises passing the substrate film through a deposition station and forming the catalytic photoresist layer over a first and second surfaces of the substrate film;
   the roughening comprises passing the substrate film through a first embossing station having a first embossing roll and a first backing roll, the first embossing roll having a roughened surface, thereby roughening the catalytic photoresist layer on the first surface, and
   passing the substrate film through a second embossing station having a second embossing roll and a second backing roll, the second embossing roll having a roughened surface, thereby roughening the catalytic photoresist layer on the second surface; and
   transferring the pattern comprises passing the substrate film through an exposure station.

12. The method of claim 11, further comprising depositing a UV (Ultraviolet) blocker layer on the first surface of the substrate.

13. The method of claim 12, further comprising depositing photoresist layer below the catalytic photoresist layer over the first and second surfaces of the substrate film.

14. The method of claim 11, further comprising passing the substrate film through a baking station to evaporate solvents from the catalytic photoresist layer.

15. The method of claim 11, wherein forming copper layers comprises electroless plating in an electroless solution comprising one of Quadrol or Ethylenediaminetetraacetic acid (EDTA) as chelating agents to generate copper RMS surface roughness of from 20 to 40 nm.

16. The method of claim 11, further comprising maintaining the first and second embossing rollers at temperature above 55° C.

17. The method of claim 11, the first and second embossing rollers have RMS surface roughness of 20-30 nm.

* * * * *